United States Patent
Naum et al.

(10) Patent No.: US 8,153,024 B2
(45) Date of Patent: Apr. 10, 2012

(54) WARM-WHITE LIGHT-EMITTING DIODE AND ITS ORANGE PHOSPHOR POWDER

(75) Inventors: Soshchin Naum, Changhua (TW); Wei-Hung Lo, Taipei (TW); Chi-Ruei Tsai, Taipei (TW)

(73) Assignees: Wei-Hung Lo, Taipei (TW); Chien-Yi Chen, Kaohsiung County (TW); Kun-Lin Chang, Sanchong, Taipei County (TW)

( * ) Notice: Subject to any disclaimer, the term of this patent is extended or adjusted under 35 U.S.C. 154(b) by 300 days.

(21) Appl. No.: 12/475,684

(22) Filed: Jun. 1, 2009

(65) Prior Publication Data

US 2009/0315449 A1   Dec. 24, 2009

(30) Foreign Application Priority Data

Jun. 20, 2008   (TW) ................................ 97123217 A

(51) Int. Cl.
*C09K 11/08* (2006.01)
*C09K 11/66* (2006.01)

(52) U.S. Cl. ............................................... 252/301.4 F
(58) Field of Classification Search ............ 252/301.4 F, 252/301.4 R; 313/467, 468; 117/942, 945
See application file for complete search history.

(56) References Cited

U.S. PATENT DOCUMENTS

| | | | |
|---|---|---|---|
| 2004/0062699 A1* | 4/2004 | Oshio | 423/263 |
| 2008/0116422 A1* | 5/2008 | Naum et al. | 252/301.4 R |
| 2008/0203892 A1* | 8/2008 | Schmidt et al. | 313/486 |
| 2008/0246005 A1* | 10/2008 | Naum et al. | 252/301.4 R |
| 2010/0187976 A1* | 7/2010 | Winkler | 313/504 |

* cited by examiner

*Primary Examiner* — Jerry Lorengo
*Assistant Examiner* — Lynne Edmondson
(74) *Attorney, Agent, or Firm* — The Weintraub Group, P.L.C.

(57) ABSTRACT

The present invention discloses an orange phosphor powder having a rare-earth aluminate have garnet structure, which is characterized by that its chemical composition is added with compounds of the IV and V groups elements and the stoichiometry formula of the orange phosphor powder is $(\Sigma Ln)_{3-x} Me^{IV}_x Al_{5-y} Si_y O_{12-(x+y)} N_{(x+y)}$. Furthermore, the present invention also discloses a warm-white Light-emitting diode employing the orange phosphor powder.

6 Claims, 7 Drawing Sheets

Spectroradiometric Analysis Report for Phosphor

Product: Y-507-2-a1-1598c-465nm-20ma
Manufacturer:
Client:
Sample No.:                              Date : July 5, 2007
Tested By :                              Reviewed By :

Test Condition
Temperature :     °C                     RH : %
Ref. Gain : 64                           Spe. Gain : 4
Spectrum Range : 380-780 nm              Scan Step : 5 nm Spectroradiometric Parameters

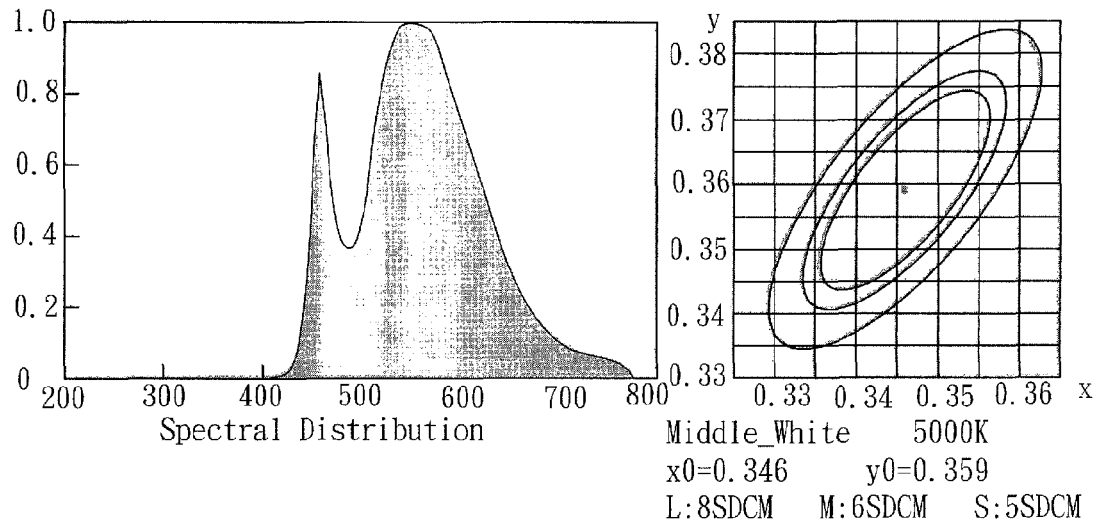

Spectral Distribution          Middle_White     5000K
                               x0=0.346     y0=0.359
                               L:8SDCM    M:6SDCM    S:5SDCM Chromaticity Coordinates : x=0.3725 y=0.4337 u=0.1997 v=0.3488
Correlated Color Temperature : 4518 K
Brightness : 26632.8
Reference White : C Light            Peak Wavelength : 560.7 nm
Dominant Wavelength : 569 nm         Bandwidth : 124.2 nm
Purity : 0.4863                      Radiant Brightness : 72.29
Color Ratio : Kr=40.8%  Kg=34.9%  Kb=24.3%
Rendering Index : Ra=68.5
R1=61    R2=78    R3=94    R4=57    R5=59    R6=71    R7=81    R8=46
R9=-52   R10=50   R11=50   R12=29   R13=67   R14=96   R15=51

SPR-920D Analyzer System for Phosphor Spectroradiometric made by
Zhejiang University Sensing Instruments Co., Ltd.

FIG. 1

Spectroradiometric Analysis Report for Phosphor

Product : YW-77-5-a1-1470c-465nm-20ma
Manufacturer :
Client :
Sample No. :                                  Date : December 11, 2007
Tested By :                                   Reviewed By :

Test Condition
Temperature :        °C                       RH : %
Ref. Gain : 64                                Spe. Gain : 2
Spectrum Range : 380-780 nm                   Scan Step : 5 nm Spectroradiometric Parameters

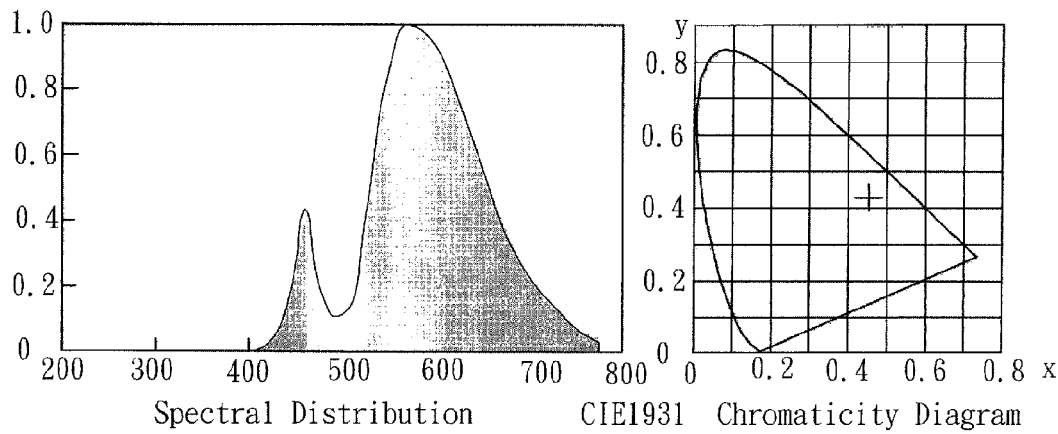

Spectral Distribution          CIE1931 Chromaticity Diagram

Chromaticity Coordinates : x=0.4528 y=0.4280 u=0.2505 v=0.3552
Correlated Color Temperature : 2935 K
Brightness   : 22111.0
Reference White : C Light          Peak Wavelength : 571.7 nm
Dominant Wavelength : 580 nm       Bandwidth : 129.5 nm
Purity : 0.6827                    Radiant Brightness : 66.041
Color Ratio : Kr=60.5%  Kg=27.9%  Kb=11.6%
Rendering Index : Ra=66.0
R1=61    R2=78    R3=89    R4=55    R5=55    R6=62    R7=82    R8=46
R9=-27   R10=44   R11=37   R12=25   R13=63   R14=93   R15=59

SPR-920D Analyzer System for Phosphor Spectroradiometric made by
Zhejiang University Sensing Instruments Co., Ltd.

FIG. 2

Spectroradiometric Analysis Report for Phosphor

Product: YW-72-2-al-1465c-465nm-20ma
Manufacturer:
Client:
Sample No.:                                      Date: December 12, 2007
Tested By:                                       Reviewed By:

Test Condition
Temperature:    °C                               RH:   %
Ref. Gain: 64                                    Spe. Gain: 2
Spectrum Range: 380-780 nm                       Scan Step: 5 nm Spectroradiometric Parameters

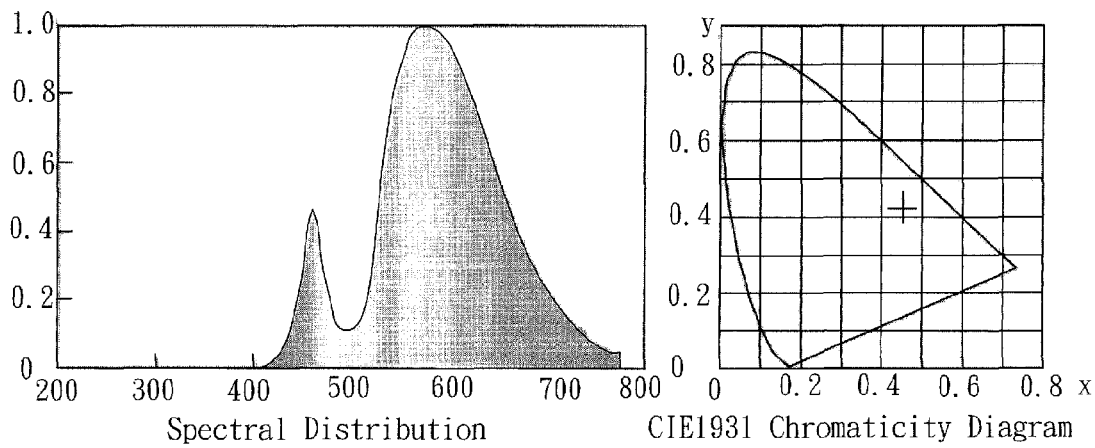

Spectral Distribution          CIE1931 Chromaticity Diagram

Chromaticity Coordinates: x=0.4514 y=0.4238 u=0.2514 v=0.354
Correlated Color Temperature: 2924 K
Brightness: 23124.5
Reference White: C Light            Peak Wavelength: 580.4 nm
Dominant Wavelength: 581 nm         Bandwidth: 129.2 nm
Purity: 0.6656                      Radiant Brightness: 69.539
Color Ratio: Kr=60.4%  Kg=27.5%  Kb=12.1%
Rendering Index: Ra=66.5
R1=61     R2=79     R3=90     R4=55     R5=56     R6=64     R7=81     R8=46
R9=-26    R10=46    R11=37    R12=28    R13=64    R14=94    R15=59

SPR-920D Analyzer System for Phosphor Spectroradiometric made by Zhejiang University Sensing Instruments Co., Ltd.

FIG. 3

Spectroradiometric Analysis Report for Phosphor

Product : YW-55-3-w-al-1465c-465nm-20ma
Manufacturer :
Client :
Sample No. :                                   Date : December 12, 2007
Tested By :                                    Reviewed By :

Test Condition
Temperature :     °C                           RH : %
Ref. Gain : 64                                 Spe. Gain : 2
Spectrum Range : 380-780 nm                    Scan Step : 5 nm Spectroradiometric Parameters

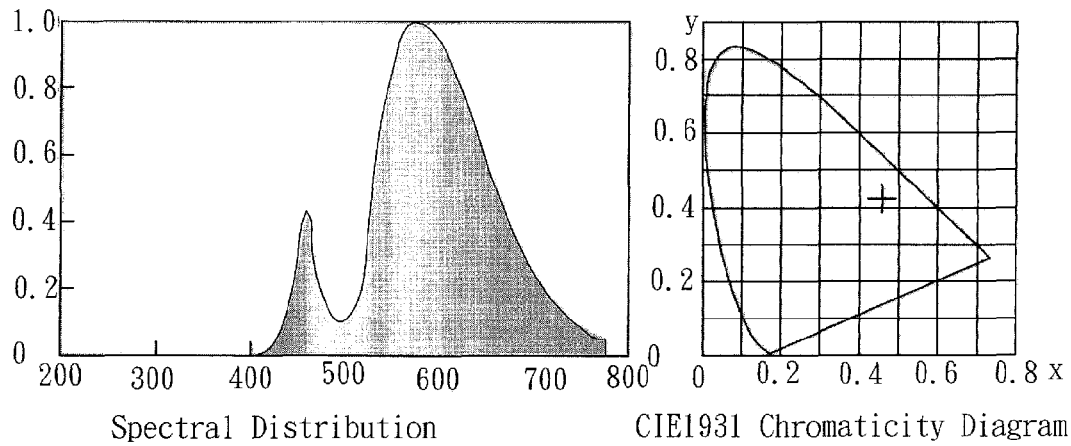

Spectral Distribution          CIE1931 Chromaticity Diagram

Chromaticity Coordinates : x=0.4569 y=0.4242 u=0.2547 v=0.3546
Correlated Color Temperature : 2846 K
Brightness : 23432.2
Reference White : C Light            Peak Wavelength : 581.5 nm
Dominant Wavelength : 581 nm         Bandwidth : 129.9 nm
Purity : 0.6830                      Radiant Brightness : 71.252
Color Ratio : Kr=61.8%  Kg=26.9%  Kb=11.3%
Rendering Index : Ra=66.1
R1=61    R2=78    R3=90    R4=54    R5=55    R6=63    R7=81    R8=46
R9=-26   R10=46   R11=36   R12=27   R13=63   R14=94   R15=59

SPR-920D Analyzer System for Phosphor Spectroradiometric made by
Zhejiang University Sensing Instruments Co., Ltd.

FIG. 4

Spectroradiometric Analysis Report for Phosphor

Product : YW-56-4-w-al-1465c-465nm-20ma
Manufacturer :
Client :
Sample No. :                                          Date    : December 12, 2007
Tested By :                                           Reviewed By :

Test Condition
Temperature :              °C                         RH : %
Ref. Gain : 64                                        Spe. Gain : 2
Spectrum Range : 380-780 nm                           Scan Step : 5 nm Spectroradiometric Parameters

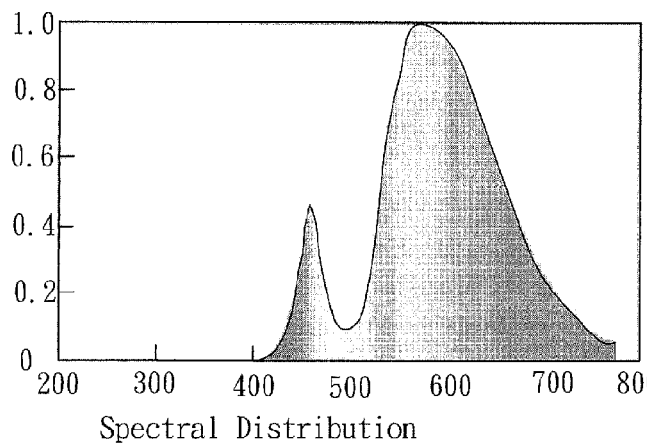
Spectral Distribution

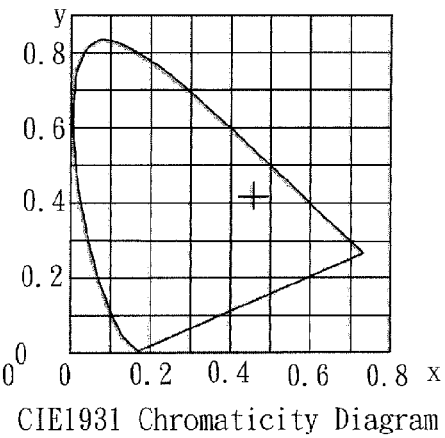
CIE1931 Chromaticity Diagram

Chromaticity Coordinates : x=0.4572 y=0.4180 u=0.2575 v=0.3532
Correlated Color Temperature : 2795 K
Brightness : 22285.5
Reference White : C Light                Peak Wavelength : 582.2 nm
Dominant Wavelength : 582 nm             Bandwidth : 133.0 nm
Purity : 0.6665                          Radiant Brightness : 69.359
Color Ratio : Kr=62.6%  Kg=25.9%  Kb=11.5%
Rendering Index : Ra=66.6
R1=62    R2=80    R3=91    R4=53    R5=56    R6=64    R7=80    R8=46
R9=-22   R10=48   R11=35   R12=30   R13=64   R14=94   R15=61

SPR-920D Analyzer System for Phosphor Spectroradiometric made by
Zhejiang University Sensing Instruments Co., Ltd.

FIG. 5

Spectroradiometric Analysis Report for Phosphor

Product : YW-57-1-w-a1-1465c-465nm-20ma
Manufacturer :
Client :
Sample No. :                                    Date : December 12, 2007
Tested By :                                     Reviewed By :

Test Condition
Temperature :      °C                           RH : %
Ref. Gain : 64                                  Spe. Gain : 2
Spectrum Range : 380-780 nm                     Scan Step : 5 nm Spectroradiometric Parameters

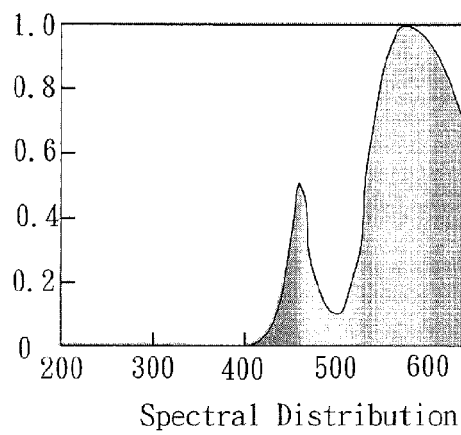

Spectral Distribution

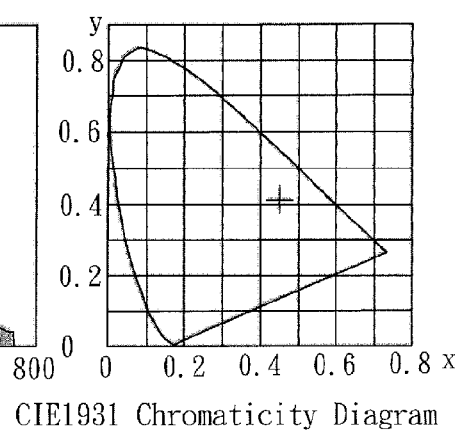

CIE1931 Chromaticity Diagram

Chromaticity Coordinates : x=0.4516  y=0.4137  u=0.2559  v=0.3515
Correlated Color Temperature : 2843 K
Brightness : 23175.6
Reference White : C Light                 Peak Wavelength : 583.2 nm
Dominant Wavelength : 582 nm              Bandwidth : 131.0 nm
Purity : 0.6402                           Radiant Brightness : 72.011
Color Ratio : Kr=61.5%  Kg=26.0%  Kb=12.5%
Rendering Index : Ra=67.0
R1=62    R2=80    R3=91    R4=53    R5=57    R6=66    R7=80    R8=46
R9=-21   R10=50   R11=35   R12=33   R13=65   R14=94   R15=61

SPR-920D  Analyzer System for Phosphor Spectroradiometric made by
Zhejiang University Sensing Instruments Co., Ltd.

FIG. 6

WARM-WHITE LIGHT-EMITTING DIODE AND ITS ORANGE PHOSPHOR POWDER

FIELD OF THE INVENTION

The present invention relates to the field of microelectronics and lighting technology, and in particular to a modern technology field called solid state lighting, which brings about gradual innovation with the heterojunction semiconductor light source based on In—Ga—N gradually replacing the light source of incandescent lamps and fluorescent lamps.

BACKGROUND OF THE INVENTION

There is another new field of semiconductor lighting technology, Solid State Lighting, developed upon the aforementioned two technology fields. A novel light source based on In—Ga—N heterojunction (please refer to S. Nakamura, Blue laser, Springer Verlag, Berlin, 1997.) has been under development. The In—Ga—N heterojunction containing a large amount of quantum wells has been developed first by a Japanese scholar, Shuji Nakamura.

The first batch of luminescent heterojunction containing a large amount of quantum wells on its luminescent planes was synthesized in 1994. Five years later, the white light-emitting diode (LED) was granted patent right. The patented LED is a semiconductor heterostructure containing phosphor powder (please refer to ROC Patent No. TW156177 granted to S. Schinuzu et al., Jan. 1, 2005.). The blue light emitted from the heterojunction (i.e. P-N junction) is combined with yellow light emitted from the phosphor powder to form white light.

In as early as 1960s, Bell Lab created LEDs employing GaAs—GaP series elements with emissions at 800~900 nm as heterojunction and the Anti-Stokes phosphor powder ($Y_2O_3S$:ErYb) as luminescent material to convert light of the infra-red region into visible light. For many years, LEDs have been developed using the same structure, in which visible light is emitted from the red and green sub-energy bands of visible light. If the radiation from the first layer, the phosphor powder, of the "Double-layer" structure (i.e. phosphor powder layer and heterojunction layer) is a short-wavelength radiation, the structure proposed by Russian engineers, B. C. Ablamov and B. P. Sushikov (please refer to A. King. "Semiconductor", World Publishing Company, Moscow, 1982) falls into the category of GaN structure, upon which is covered with the Stokes phosphor powder (converting part of primary radiation from the GaN heterojunction structure into long-wavelength radiation). In summary, the LEDs' Double-Layer Structure has been widely known in 1965-80.

White LEDs are characterized by that it combines two radiations: short-wavelength radiation (blue light) and long-wavelength radiation (yellow); the combination is based on Newton's principle of complementary color. According to the principle, a pair of complementary colors, blue and yellow, pale blue and orange-yellow, blue-green and red, for example, can be combined to form white light. For a long time, the electron-emission technology such as cathode ray tube (CRT) of black-and-white television as well as Radar has employed the principle of complementary color (please refer to K. Mordon and B. Zvoryki, Television, the World Publishing Company, 1955; Leverenz Luminescence of solid, NY, 1950). Fluorescent particles of ZnS and Ag are distributed on the fluorescent screen in Radar tubes to generate photoluminescence. The landing spots of electron beams are shown to have very bright white light, which is formed by combining two individual spectrums of the phosphor power. On the other hand, the display screen of black-and-white TV employs multi- or single-layer of phosphor powder, which comprises two cathodes phosphor powders (of blue and yellow) emitting white light by combining blue and yellow lights.

Consequently, the aforementioned approach is to convert a short-wavelength radiation into a long-wavelength one by a phosphor powder. Two lights (blue and yellow) emitting together to form white light. This approach has been known for a long time.

Later, there emerged a yellow phosphor powder with special composition, which is applied along with the In—Ga—N heterojunction with a blue light radiation. Designers have proposed to use yttrium-aluminum garnet $Y_3Al_5O_{12}$:Ce as this yellow phosphor powder (please refer to ROC Patent No. TW156177 granted to S. Schinuzu et al., Jan. 1, 2005.). Therefore, many companies producing white LEDs are forbidden to use this phosphor powder because these companies are not patented to use the material. However, the cathode phosphor powder based on $Y_3Al_5O_{12}$:Ce was developed by Blasse G in 1960s (please refer to B. C. Ablamov B. P. Sushikov, Soviet Union Publication, N635813, Sep. 12, 1977) and widely applied in actual production to make scintillator, especially CRT screens. In a CRT screen, the mixture of blue and yellow cathode phosphor powders, $Y_2SiO_5$:Ce and $(Y,Gd)_3Al_5O_{12}$:Ce, are used.

Although the technology has been widely applied, some drawbacks still remain: (1) LEDs can only generate white light with a high color temperature $T \geq 6500K$ and chromaticity coordinates as $0.30 \leq x \leq 0.31$ and $0.30 \leq y \leq 0.32$; (2) the first generation of LEDs has a very low efficiency, less than 10 lumen/watt.

Presently, there are a large number of patents granted to improve the aforementioned drawbacks. The improvements are largely related to the creation of so-called warm white light source with a color temperature $2500K \leq T \leq 3500K$ and chromaticity coordinates as $0.40 \leq x \leq 0.44$ and $0.38 \leq y \leq 0.44$.

Another plausible scheme concerning the creation of such a warm-white light source is to employ phosphor powder which can generate orange-yellow or orange-red under the blue light activation of the In—Ga—N heterojunction. The present inventors have delivered the concept in the US Patent Application No. US2007/0272 899A (Please refer the US Patent Application No. US2007/0272 899A submitted by N. P. Soshchin et al., Nov. 29, 2007); a phosphor powder of this kind was proposed and can generate orange-red radiation under the activation of cerium and praseodymium ions of yttrium garnet.

This kind of phosphor powder has been produced in many companies across the world and can ensure that (1) the color temperature of the white semiconductor light source is T>3000K, in particular, 3200~3500K, and (2) the luminescence efficiency of LEDs can reach 50~75 lumen/watt.

Nevertheless, there exist some substantive drawbacks for this phosphor powder: (1) the non-uniform white color of $\lambda_{max}$=548 nm, the peak wavelength of the radiation of the phosphor powder on the lens cover of LEDs, and the peak wavelength $\lambda_{max}$=610 nm, leads to a non-uniform white light; (2) the synthesis of the phosphor powder is complicated and hard to be repeated; (3) the quantum output of the phosphor powder produced is low, 75~85% only; and (4) white light with a color temperature $T \leq 3000K$ cannot be obtained. Thus, there exists a need to overcome these drawbacks.

SUMMARY OF THE INVENTION

To overcome the prior drawbacks described above, the main object of the present invention is to provide an orange-yellow phosphor powder and warm-white light-emitting diodes using the phosphor powder capable of eliminating the aforementioned drawbacks.

To overcome the prior drawbacks described above, another object of the present invention is to provide an orange-yellow phosphor powder to ensure the LEDs emitting stable warm-white radiation.

To overcome the prior drawbacks described above, another object of the present invention is to provide a new orange-yellow phosphor powder, of which chemical composition has not been mentioned in any prior patent.

To achieve these objects of the present invention, an orange-yellow phosphor powder according to the present invention is rare-earth aluminate having the garnet structure, which is characterized by that its chemical composition is added with compounds of the IV and V groups elements and the stoichiometry formula of the orange phosphor powder is $(\Sigma Ln)_{3-x}Me^{IV}_xAl_{5-y}Si_yO_{12-(x+y)}N_{x+y}$.

To achieve these objects of the present invention, a warm-white light-emitting diode according to the present invention is based on the substrate of In—Ga—N heterojunction having a large amount of quantum wells and a spectrum converter and is characterized by that all the luminescent planes and laterals of the spectrum converter are connected, the spectrum converter is distributed in the light-emitting diode in uniform thickness and symmetrical with respect to the center.

BRIEF DESCRIPTION OF THE DRAWINGS

The present invention can be more fully understood by reference to the following description and accompanying drawings, in which:

FIG. 1 illustrates the spectrum analysis of the phosphor powder with a standard composition $(Y_{0.75}Gd_{0.22}Ce_{0.03})_3Al_5O_{12}$;

FIG. 2 illustrates the spectrum analysis of the phosphor powder with a composition of $(Gd_{0.6}Y_{0.25}Lu_{0.05}Tb_{0.05}Ce_{0.03})_3Zr_{0.06}Al_{4.99}Si_{0.01}O_{11.984}$ (No. 2 in TABLE 1);

FIG. 3 illustrates the spectrum analysis of the phosphor powder with a composition of $(Gd_{0.67}Y_{0.2}Lu_{0.05}Tb_{0.02}Ce_{0.03})_3Zr_{0.09}Al_{4.98}Si_{0.02}O_{11.971}$ (No. 3 in TABLE 1);

FIG. 4 illustrates the spectrum analysis of the phosphor powder with a composition of $(Gd_{0.7}Y_{0.1}Lu_{0.04}Tb_{0.04}Ce_{0.04})_3$ $Zr_{0.24}Al_{4.96}Si_{0.04}O_{11.936}$ (No. 4 in TABLE 1);

FIG. 5 illustrates the spectrum analysis of the phosphor powder with a composition of $(Gd_{0.72}Y_{0.1}Lu_{0.01}Tb_{0.01}Ce_{0.02})_3Zr_{0.42}Al_{4.92}Si_{0.08}O_{11.878}$ (No. 5 in TABLE 1);

FIG. 6 illustrates the spectrum analysis of the phosphor powder with a composition of $(Gd_{0.75}Y_{0.08}Lu_{0.05}Tb_{0.05}Ce_{0.05})_3Hf_{0.06}Al_{4.9}Si_{0.1}O_{11.894}$ (No. 6 in TABLE 1)

DETAILED DESCRIPTION OF THE PREFERRED EMBODIMENT

Figure 7A:
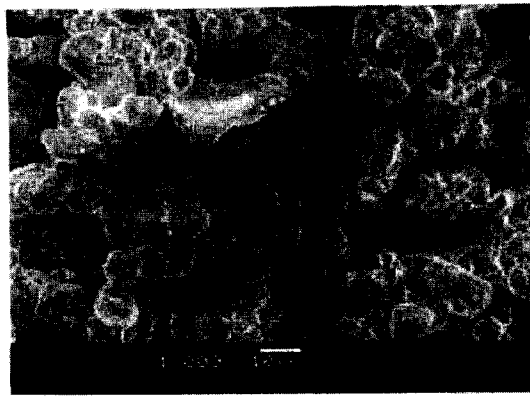
FIGS. 7a~7f illustrate the particles morphologies of the samples of the phosphor powders.

First of all, the general object of the present invention is to eliminate the aforementioned drawbacks of the phosphor powder and the warm-white LEDs using the phosphor powder. To achieve the object, an orange-yellow phosphor powder according to the present invention is rare-earth aluminate having the garnet structure, which is characterized by that its chemical composition is added with compounds of the IV and V groups elements and the stoichiometry formula of the orange-yellow phosphor powder is $(\Sigma Ln)_{3-x}Me^{IV}_xAl_{5-y}Si_yO_{12-(x+y)}N_{x+y}$, wherein Ln=Y, Gd, Ce, Lu, and Tb; $Me^{IV}$=Zr and/or Hf; and its stoichiometry indexes are $0.001 \leq x \leq 0.1$ and $0.001 \leq y \leq 0.1$; and wherein the phosphor powder luminesces in the orange-yellow region of the spectrum, ranging from 490~770 nm, with a maximum wavelength of $\lambda_{max} \geq 570$ nm and half bandwidth larger than 120 nm.

The condition for the formation of the rare-earth cationic sub-crystal in the phosphor powder is as follows:

$$\Sigma Ln = mY + Gd + pCe + qLu + lTb,$$

wherein $m+n+p+q+l=3-x$.

The concentration of the rare-earth cationic crystal in the phosphor powder is as follows:

Y: $0.05 \leq m/f \leq 0.25$; Gd: $0.50 \leq n/f \leq 0.65$; Ce: $0.001 \leq p/f \leq 0.1$; Lu: $0.001 \leq q/f \leq 0.05$; and Tb: $0.001 \leq l/f \leq 0.05$.

The concentration of silicon ion $Si^{+4}$ in the anionic sub-crystal is $0.001 \leq [Si] = y \leq 0.1$ atomic fraction.

The concentration of IV group ions in the cationic sub-crystal is $0.001 \leq x \leq 0.1$ atomic fraction.

The particles of the phosphor powder are slightly round with a median particle size of $2.2 \leq d_{50} \leq 5$ μm.

The particles of the phosphor powder have a shape of sphere cone with a very high light transparency.

The physical chemistry principle of the phosphor powder according to the present invention is outlined hereinafter. First, the composition of the phosphor powder is substantively differently from the known composition. Second, the present phosphor powder contains five rare-earth elements: gadolinium (Gd), yttrium (Y), cerium (Ce), terbium (Tb), and lutetium (Lu). Third, the cationic sub-crystal is added with metal elements of IV group, Zr and/or Hf, both of which have an oxidation state of +4. Fourth, the anionic sub-crystal is added with Si, a IV group metal element, with an oxidation state of +4. Fifth, the anionic sub-crystal is added with a V group element, N for example, with an oxidation state of −3.

The composition is characterized by that $Zr^{+4}$ and/or $Hf^{+4}$ ions substitute dominant ions $Gd^{+3}$, $Tb^{+3}$, and $Lu^{+3}$ (the substitution of ions in a cationic sub-crystal follows the principles of ionic equilibrium). The ionic radius of $Gd^{+3}$ is $\tau_{Gd}=0.95$ Å with a coordination valence of K=6. The ions radius of the rare-earth ion $Tb^{+3}$ $\tau_{Tb}=0.89$ Å and $Lu^{+3}$, $\tau_{Lu}=0.85$ Å. For the metal ions of IV group elements, $Zr^{+4}$ and $Hf^{+4}$, substituting the dominant ions, the radius is $\tau_{Zr}=0.82$ Å and $\tau_{Hf}=0.89$ Å, respectively.

Ions substituting ions with different ionic valences should also follow the valence equivalence rule. Those substituting and those substituted have different oxidation states. The dominant ions $Zr^{+4}$ and $Hf^{+4}$ have a four-valence state. The substitution of ions with unequal valences leads to the formation of point defects. $Zr^{+4}$ ions entering the cationic crystal substitute three-valence $Gd^{+3}$ will at the same time form $(Zr_{Gd})\cdot$, i.e. the total excessive valence with the substitution of $Gd^{+3}$ by $Zr^{+4}$ is represented by one round dot above the right bracket.

Similarly, four-valence $Hf^{+4}$ substituting $Gd^{+3}$ will form $(Hf_{Gd})\cdot$. When $Lu^{+3}$ and $Tb^{+3}$ are substituted by the ions of group IV elements, the charge state of the defects will not change and, at the same time, maintain isovalence substitution of ions. It is noted that the stoichiometry principle of the compound composition of the phosphor powder according to the present invention will no longer hold. Nevertheless, the substituted ions will not disappear or evaporate. The approach according to the present invention is to pre-calculate the required quantities of the main composition and the zirconium and/or hafnium added must obey the stoichiometry quantities of ions in the cationic sub-crystal.

Further, the establishment of the anionic sub-crystal of the phosphor powder is described as follows: First, the un-equivalent valence substitution will also occur in the anionic sub-crystal. In the lattice points of anions, an $Al^{+3}$ ion having radius of $\tau_{Al}=0.57$ Å is substituted by a $Si^{+4}$ ($\tau_{Si}=0.41$ Å) of an oxidation of 4 along with a point defect ($Si_{Al}$).

Consequently, two point defects are formed in the cationic and anionic sub-crystals and, in the mean time, two redundant positive charges exist in the crystal. The present invention proposes to add $N^{-3}$ into the anionic sub-crystal to compensate charges. One redundant negative charge is obtained when $O^{-2}$ is substituted by $N^{-3}$, i.e. $(N_O)'$. In this way, the valence equilibrium is established under the following condition: $(Me_{Gd})^{\bullet}{}_x + (Si_{Al})^{\bullet}{}_y = (N_O)'{}_{x+y}$.

Anionic lattice points ($O_O$) are needed to expand geometrically when the heterovalence center $(N_O)'$ is formed. Because the radius of $O^{-2}$ is $\tau_O=1.33$ Å and nitrogen ion $N^{-3}$, $\tau_N=1.48$ Å, their difference in radius is +10%, which is possible according to the crystal chemistry standard.

However, the ions substitution in the cationic and anionic sub-crystals in the phosphor powder will increase the substituted lattice parameter of the garnet. According to the present invention, the conventional yttrium aluminum garnet $Y_3Al_5O_{12}$ has a lattice parameter of a=1.2001 nm, and when yttrium is partially substituted with gadolinium, the value will increase to be a=1.2110 nm. If gadolinium is partially substituted by terbium (Tb) ions, the lattice parameter will become $a_{Tb}=1.1942$ nm. When a large amount of lutetium ions is added into the crystal of the phosphor powder, the value will be $a_{Lu}=1.1932$ nm. According to the aforementioned results of the present invention, smaller spacing between ionic lattice points give rise to a denser crystal.

The heterovalence substitution of the ions of IV group elements substituting the main cations will not change the lattice parameter of the crystal because the amount of the added ions is not large. Similarly, nitrogen ions ($N^{-3}$) added into the anionic crystal to substitute oxygen ions ($O^{-2}$) will not change the lattice parameter either.

As the lattice parameter of the garnet (commonly seen garnet $O^{10}{}_n$-Ia3d) phosphor powder according to the present invention decreases, the internal lattice parameter changes accordingly. Also, for the main active ions $Ce^{+3}$, the change of lattice parameter will not be diminished with the decreasing activation of $5D_2$ ions. Consequently, the radiation spectrum of $Ce^{+3}$ ions is substantially extended and shifted to the longer wavelength region of the visible light. The phosphor powder activated by $Ce^{+3}$ has a radiation spectrum $\lambda=490\sim770$ nm. The following figures can explain the situation more clearly. FIG. 1 illustrates the spectrum analysis of the phosphor powder of the standard composition, $(Y_{0.75}Gd_{0.22}Ce_{0.03})_3Al_5O_{12}$, in which the spectrum range is $\lambda=505\sim720$ nm, the peak wavelength of the spectrum is $\lambda_{max}=560.7$ nm, and the half bandwidth is $\lambda_{0.5}=124.2$ nm.

FIG. 2 illustrates the spectrum analysis of the phosphor powder $(Gd_{0.6}Y_{0.25}Lu_{0.05}Tb_{0.05}Ce_{0.03})_3$ $Zr_{0.006}Al_{4.99}Si_{0.01}O_{11.984}$ (No. 2 in TABLE 1), in which the spectrum range is $\lambda=498\sim780$ nm, the peak wavelength of the spectrum is $\lambda_{max}=571.7$ nm, and the half bandwidth is $\lambda_{0.5}=129.5$ nm.

FIG. 3 illustrates the spectrum analysis of the phosphor powder $(Gd_{0.67}Y_{0.2}Lu_{0.05}Tb_{0.02}Ce_{0.03})_3$ $Zr_{0.09}Al_{4.98}Si_{0.02}O_{11.971}$ (No. 3 in TABLE 1), in which the spectrum range is $\lambda=495\sim785$ nm, the peak wavelength of the spectrum is $\lambda_{max}=580.4$ nm, and the half bandwidth is $\lambda_{0.5}=129.2$ nm, the values essentially identical to those of FIG. 2.

FIG. 4 illustrates the spectrum analysis of the phosphor powder $(Gd_{0.7}Y_{0.1}Lu_{0.04}Tb_{0.04}Ce_{0.04})_3$ $Zr_{0.24}Al_{4.96}Si_{0.04}O_{11.936}$ (No. 4 in TABLE 1), in which the spectrum range is $\lambda=496\sim789$ nm, the peak wavelength of the spectrum is shifted to $\lambda_{max}=581.5$ nm, and the half bandwidth is $\lambda_{0.5}=129.9$ nm.

FIG. 5 illustrates the spectrum analysis of the phosphor powder $(Gd_{0.72}Y_{0.1}Lu_{0.01}Tb_{0.01}Ce_{0.02})_3$ $Zr_{0.42}Al_{4.92}Si_{0.08}O_{11.878}$ (No. 5 in TABLE 1), in which the spectrum range is %=496~796 nm, the peak wavelength of the spectrum is $\lambda_{max}=582.2$ nm, and the half bandwidth is $\lambda_{0.5}=133$ nm.

FIG. 6 illustrates the spectrum analysis of the phosphor powder $(Gd_{0.75}Y_{0.08}Lu_{0.05}Tb_{0.05}Ce_{0.5})_3$ $Hf_{0.06}Al_{4.9}Si_{0.1}O_{11.894}$ (No. 6 in TABLE 1), in which the spectrum range is $\lambda=498\sim798$ nm and the peak wavelength of the spectrum is $\lambda_{max}=583.2$ nm; the reason why the half bandwidth is smaller will be discussed hereafter in the present invention.

The following conclusions can be drawn from FIGS. 1 to 6: (1) The spectrum widths of the phosphor powders according to the present invention are large, 60~90 nm wider than that of the standard phosphor powder; (2) the spectrum of the phosphor powders according to the present invention is shifted to the longer wavelength region by a maximum of 23 nm; and (3) the half bandwidth of the phosphor powders according to the present invention is enlarged by 9 nm.

With the changes of the spectrum curves (part of the data are shown in TABLE 1), the radiation spectrums of the phosphor powders have other changes. The dominant wavelength, for example, is changed from $\lambda=569$ nm to $\lambda=582$ nm. A typical example is that the chromaticity coordinates of the radiation (with reference to TABLE 1) and the color purities are all changed. It is noted that the peak wavelengths of the phosphor powders are located in the orange-yellow region of the radiation.

For the phosphor powder to have the aforementioned advantages in spectrum, the ratio of the rare-earth elements in the cationic sub-crystal is $$\Sigma Ln = mY + nGd + pCe + qLu + lTb,$$

wherein, m+n+p+q+l=3−x.

One important characteristic of the phosphor powders according to the present invention is that, in addition to the elements or group IV elements, i.e. Zr and/or Hf, added into the cationic sub-crystal, the sum of all the rare-earth elements is 0.03 atomic fraction. The range of the added ions is $0.001 \leq x \leq 0.1$ atomic fraction.

It is noted that the concentrations of the main elements of the cationic sub-crystal; i.e. $Gd^{+3}$, $Y^{+3}$, $Lu^{+3}$, $Tb^{+3}$, and $Ce^{+3}$; will affect the radiation spectrum. The concentrations of the added $Zr^{+4}$ and $Hf^{+4}$ have a smaller effect on the change of the spectrum of the phosphor powder according to the present invention.

For example, if a large amount of $Zr^{+4}$ is added into the cationic sub-crystal, the half bandwidth of the radiation spectrum can be increased by $\Delta=1\sim1.5$ nm. On the other hand, if a low concentration of $Zr^{+4}$ is added, the half bandwidth will be reduced by $\Delta=2\sim2.5$ nm. The addition of $Hf^{+4}$ will substantially change the afterglow period of the phosphor powders. The addition of $Hf^{+4}$ into the cationic sub-crystal will increase the afterglow period from $\tau_e=100$ nano-seconds to $\tau_e=122$ nano-seconds. This parameter indicates that the luminescence decay period of the phosphor powders reduced by 1/e time after the activation. An addition of a small amount of $Hf^{+4}$ can reach such an effect. When the concentration of $Hf^{+4}$ reaches 0.01%, the afterglow period can be increased, yet if the concentration $Hf^{+4}$, $[Hf^{+4}] \leq 0.001$, the afterglow is reduced to $\tau_e = 98$ nano-seconds.

TABLE 1 lists the lighting parameters of the phosphor powders according to the present invention, including chromaticity coordinates, dominant wavelength, luminescence purity, and color temperature, which indicate that the present phosphor powders are orange-yellow luminescent materials. For the best knowledge of the inventors, no orange-yellow phosphor powder based on garnet has been reported in literature.

TABLE 1

| No | Basic composition | Additives (atomic fraction) | | Chromaticity Coordinates | Peak Wavelength $\lambda_{max}$, nm | Half Bandwidth $\lambda_{0.5}$ | Color Temperature CT, (K) |
|---|---|---|---|---|---|---|---|
| | | $SiO_2$ | MeN | | | | |
| 1 | $(Y_{0.75}Gd_{0.22}Ce_{0.03})_3Al_5O_{12}$ | — | — | 0.3725 0.4337 | 560.7 | 124.2 | 4518 |
| 2 | $(Gd_{0.6}Y_{0.25}Lu_{0.05}Tb_{0.05}Ce_{0.03})_3Zr_{0.06}Al_{4.99}Si_{0.01}O_{11.984}$ | 0.01 | 0.006 | 0.4528 0.4280 | 571.7 | 129.5 | 2935 |
| 3 | $(Gd_{0.67}Y_{0.2}Lu_{0.05}Tb_{0.02}Ce_{0.03})_3Zr_{0.09}Al_{4.98}Si_{0.02}O_{11.971}$ | 0.02 | 0.009 | 0.4514 0.4238 | 580.4 | 129.2 | 2924 |
| 4 | $(Gd_{0.7}Y_{0.1}Lu_{0.04}Tb_{0.04}Ce_{0.04})_3Zr_{0.24}Al_{4.96}Si_{0.04}O_{11.936}$ | 0.04 | 0.024 | 0.4569 0.4242 | 581.5 | 129.9 | 2846 |
| 5 | $(Gd_{0.72}Y_{0.1}Lu_{0.01}Tb_{0.01}Ce_{0.02})_3Zr_{0.42}Al_{4.92}Si_{0.08}O_{11.878}$ | 0.08 | 0.042 | 0.4572 0.4180 | 582.2 | 131 | 2795 |
| 6 | $(Gd_{0.75}Y_{0.08}Lu_{0.05}Tb_{0.05}Ce_{0.05})_3Hf_{0.06}Al_{4.9}Si_{0.1}O_{11.894}$ | 0.10 | 0.06 | 0.4516 0.4137 | 583.2 | 131 | 2843 |

It is noted that the orange-yellow phosphor powder can be obtained if the following condition is met. The rare-earth elements involved have concentrations as Y: $0.05 \leq m/m+n+p+q+l \leq 0.25$, Gd: $0.50 \leq n/m+n+p+q+l \leq 0.65$ Ce: $0.001 \leq p/m+n+p+q+l \leq 0.1$ Lu: $0.001 \leq q/m+n+p+q+l \leq 0.05$ Tb: $0.001 \leq l/m+n+p+q+l \leq 0.05$ Some additional information has to add for the present invention. First, it has been pointed out that the concentration of yttrium cation is less than 0.25 atomic fractions and the atomic fraction of gadolinium ion can reach 0.65. The maximum concentration ratio of these two elements is $[Gd]/[Y]=2.6$. Consequently, the phosphor powder can be named as gadolinium-yttrium garnet. The phosphor powder, however, has other elements ($Lu^{+3}$ and $Tb^{+3}$) as its ingredient. These two elements are added to control the cubic lattice parameter of the phosphor powder. As described above, the elements added can reduce the lattice parameter of the crystal and increase the tension of the internal crystal. Although the atomic masses of yttrium (Y), lutetium (Lu) and, terbium (Tb) are different, their concentrations in the phosphor powder are the same. Therefore, the atomic fractions of these elements can reach 0.05. Consequently, the phosphor powder according to the present invention is named as GYLTAG (gadolinium-yttrium-lutetium-terbium-aluminum garnet).

Different additions of $Ce^{+3}$ ions will also have a significant effect. If the concentration of $Ce^{+3}$ is low, the half bandwidth of the spectrum curve will increase by $\Delta = 1\sim3$ nm. On the other hand, if this highly active ion is added with a high concentration, the peak wavelength of the spectrum will decrease. The advantage for the phosphor powder with a high concentration of $Ce^{+3}$ is that, when the phosphor powder is activated by a LED, the activating power will be substantially changed, and the re-radiation will be highly linear. When the optical activation on the heterojunction is $10^{21}\sim10^{23}$ photon/$cm^2$, these blue photons fall onto the particles surface of the phosphor powders and generate fluorescence; the quantum output of the process is close to 1 (0.95). If the radiation power of the semiconductor heterostructure is increased ten times, the amount of photon quantum emitted from the standard garnet phosphor powder will enhance 6~7 times. The phenomenon is no longer linear and is called the saturated phenomenon or the non-linearity of the luminescent materials of white LEDs (according to the linear principle, an 10 times increase of power will result in a 10 times increase of photon number).

Our research works have shown that when the initial concentration of the active ions $Ce^{+3}$ is increased to 50~75%, the saturation of phosphor powder resulted from exciting activating power can be eliminated. According to the present invention, the aforementioned description mainly concerns the optical re-activation of the phosphor powder. If heat is increased during the process of increasing the power of LEDs, the radiation energy will experience a drop. This drop is due to the fact that the material based on the phosphor powder expands with increasing temperature, and the heat expansion reduces the internal crystal field, leading to a drop in luminescent energy. It is found that in the present invention, when the phosphor powder is heated to 125° C., the luminescence efficiency will be reduced to half of its original value. The effects of the compositions of phosphor powders are investigated with specialized instruments in the present invention. For the phosphor powders according to the present invention, when the temperature is heated to T=140° C., the phosphor powder with the largest amount of $Gd^{+3}$ retains 85~87% of its luminescence efficiency and the value for the phosphor powder with smaller amount of $Gd^{+3}$, on the other hand, is 89~91%.

The phosphor powder according to the present invention has the advantages because the concentration of $Si^{+4}$ is $0.001 \leq [Si] = y \leq 0.1$.

As indicated in the chemical equivalence formula of the phosphor powder, silicon is added to the phosphor powder; to be more precise, part of $Al^{+3}$ is fully substituted by the anionic sub-crystal. In the present invention, it is found that the addition of $Si^{+4}$ into the phosphor powder can also shift the radiation spectrum of $Ce^{+3}$ in the yttrium-gadolinium garnet to the region of larger wavelength. Undoubtedly, the effects of silicon ions is less strong than that of the isovalence substitution of yttrium-gadolinium, which can shift the radiation spectrum toward the red light region by 45~50 nm compared to 8~10 nm shifted by $Si^{+4}$ ions.

It is noted that the addition of $Si^{+4}$ will change the structure of the activating spectrum of the phosphor powder: the maximum absorption range is shifted from $\lambda=450\sim455$ nm to $\lambda=460\sim465$ nm. The surface of the particles of the phosphor powder has two different colors: grey and pale-red. However, the optical absorption and light transmittance of the phosphor powder will not be changed.

It is understood that the concentration range of $Si^{+4}$ is $0.001 \leq Si \leq 0.1$ atomic fraction. When silicon ion is in its lowest concentration, i.e. $Si^{+4}=0.001$ atomic fraction, the concentration ratio of the main ingredients is $Gd/Y=2.6$ and the peak wavelength is unchanged. On the other hand, when the concentration of $Si^{+4}$ is 0.01 atomic fraction, the bathochromic shift is clearly shown to be $\Delta=1$ nm. The optimum concentration of $Si^{+4}$ is 0.045~0.065 atomic fraction, inside which the bathochromic shift can reach 8~10 nm and at the same time, the half bandwidth is enlarged by 1.5~2.5 nm. The light emitted from the phosphor powder is in the orange-yellow region of the spectrum.

This advantage of the phosphor powder can be realized under the following condition: the IV group elements are added into the cationic sub-crystal and the concentration of the elements being $0.001 \leq x \leq 0.1$ Undoubtedly, the amount of $Zr^{+4}$ and/or $Hf^{+4}$ ions added is very close to the concentration of $Si^{+4}$ added into the anionic sub-crystal of the phosphor powder. This is the physical chemistry reason for the addition of $Zr^{+4}$ and/or $Hf^{+4}$ ions into the cationic sub-crystal. By comparing the peak wavelength of FIG. 1 with those of the other figures, it is understood that the addition of these elements is conducive to the absorption ability of phosphor powders. If no zirconium and/or hafnium is added into the standard sample (with reference to FIG. 1), the primary reflection of blue light of the heterojunction will be very high. On the other hand, for the phosphor powder added with zirconium and/or hafnium, the reflection of blue light will be reduced by 1.5~1.8 times and in the mean time, the brightness of the phosphor powder is enhanced, rather than reduced.

The present invention has pointed out that the heterovalence substitution in the cationic and anionic sub-crystals will be accompanied with the formation of point defects with positive charge. Many approaches can be used to preserve charge neutrality. The approach adopted by the present invention is to add negative-charge nitrogen ions ($N^{-3}$) into the anionic sub-crystal and form $(N_O)'$ centers. It has point out that the product $(N_O)'$ is not very stable and will set off vigorous reactions during the synthesis of phosphor powder at high temperature. The present inventors have proposed the way of adding ZrN or HfN: the addition of ZrN or HfN into the phosphor powder will immediately produce pairs of point defects. When the phosphor powder is being prepared, the thermal treatment is characterized by the addition of zirconium nitride or hafnium nitride into the phosphor powder.

Zirconium nitride or hafnium nitride is added into the phosphor powder and the oxide ingredients are thermally treated in a reduction atmosphere at high temperature. The process is characterized by that the IV group nitrides, HfN and/or ZrN, or their molecule equivalent mixtures are placed in a furnace for 4~8 hours at 1520° C.~1700° C. and in the furnace atmosphere, the hydrogen concentration is 2~5% of that of nitrogen-hydrogen mixture.

As described above, the concentration of negative-charge $N^{-3}$ in the anionic sub-crystal is $0.001 \leq [N] \leq 0.1$. The equilibrium equation of the point defects in the cations and anionic sub-crystals is $(Me^{IV}_{Ln})^{\cdot}+(Si_{Al})^{\cdot}=2(N_O)'$.

More specifically, for the IV group elements, the equilibrium equations are

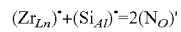

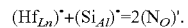

There are many standard synthesis processes for garnet phosphor powder according to the synthesis process. The ingredients of the rare-earth oxides, $Gd_2O_3$, $Y_2O_3$, $CeO_2$, $Lu_2O_3$, and $Tb_4O_7$, are used to form aluminum oxide of the anionic sub-crystal and even solid catalyst can be added as ingredient; solid catalyst can accelerate the process to form garnet from the mixture of aluminum oxide ($Al_2O_3$) and mono-aluminate ($LuAlO_3$). The reaction equation is as follows:

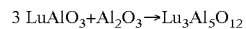

Barium fluorides ($BaF_2$ and $AlF_3$) are usually used as catalyst for the reaction.

Part of agents can be changed. In a sol-gel process, for example, oxides can be replaced by hydroxides, but solid reaction does not change. As described above, the phosphor powder according to the present invention should be added with ZrN and/or HfN, or even silicon oxide ($SiO_2$). The concentrations of the ingredients are as follows:

Gadolinium Oxide $Gd_2O_3$—0.6M (mole)
Yttrium Oxide $Y_2O_3$—0.25M
Lutetium Oxide $Lu_2O_3$—0.05M
Terbium Oxide $Tb_4O_7$—0.025M
Cerium Oxide $CeO_2$—0.05M
Zirconium Oxide ZrN—0.005M
Silicon Oxide $SiO_2$—0.01M
Aluminum Oxide $Al_2O_3$—2.49M
Barium Oxide $BaF_2$—0.32M The ingredients are placed in a roller-grinding machine for one hour under 60 RPM and then put into a 0.8-liter steel-aluminum crucible, which in turn are left in a furnace with a weak-reduction atmosphere (2% $H_2$ and 98% $N_2$) for 6~8 hours at 1520~1620° C. After removed from the furnace, the ingredients are acid washed in a hot sulfide acid solution (1:1) followed by water washing. The surface of the phosphor powder particles is covered with a nano-layer of $ZnO.4SiO_2$, which is formed from the solution of $ZnSO_4.7H_2O$ (1%) and $Na_2SiO_3$ (1%). Finally, the phosphor powder are screened through a filter and air dried at T=120° C. for two hours to become particles. The particles of the phosphor powder prepared by this synthesis process are bright yellow-orange.

The spectrum and colorimetric characteristics of the phosphor powder can be measured by the spectroradiationmeter of Sensing Instruments Company. The parameters obtained in the spectrum curve include:

Chromaticity coordinates x, y;
Chromaticity coordinates u, v;
Peak wavelength;
Relative luminescent intensity;
Half bandwidth;
Color purity;
Color temperature (K);
Rendering index Ra;
Dominant wavelength, $\lambda_{max}$; and
Color ratio, $K_R$, $K_G$, $K_B$.

FIG. 1 shows the radiation spectrum of the standard phosphor powder $(Y_{0.75}Gd_{0.22}Ce_{0.033})_3Al_5O_{12}$ and its corresponding parameters of all the samples are listed in TABLE 1. From TABLE 1, it is clear that the radiation of the phosphor powder is largely located in the orange-yellow sub-energy band according to the chromaticity coordinates, and compared with that of the standard sample, the peak wavelength of other samples is shifted by $\Delta \approx 22$ nm and the half bandwidth is changed from $\lambda_{0.5}=124$ nm to $\lambda_{0.5}=133$ nm. Also, the color temperature is changed by 1700K and the luminescent intensity is L=83~87% when compared with the standard sample. According to the aforementioned data, and the spectral radiation of the phosphor powder in the region of $\lambda=555$~583 nm, it is believed that the synthesized orange-yellow phosphor powder has a very high quantum output of radiation; the values of the No. 3 and No. 4 samples are much higher than $\eta=0.95$ of the standard sample.

Figure 7B:
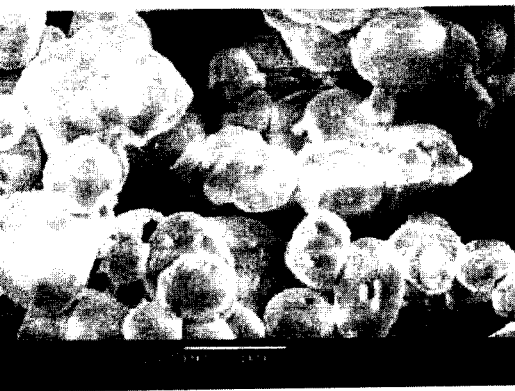

Similar to the measurements of the spectrum and colorimetric characteristics of the phosphor powder samples, a specialized instrument, laser granularity analyzer, is used to measure the granularity of the phosphor powder, and even microscopes can be used to verify the morphology of the particles of the phosphor powder. During the measurement process, the inventors find that the particles of the phosphor powder are round. The round shape is important because when the heterojunction is filled with the light conversion layer of phosphor powder, this kind of particle shape will not damage the surface of the heterojunction. FIGS. 7a to 7f illustrate the microstructures of the particles of the phosphor powder samples. FIGS. 7a and 7b are for the No. 2 phosphor powder shown in TABLE 1; the particles are round, some are spherical, and the number of facet of every particle is more than 12.

Figures 7C, 7D:

FIGS. 7c and 7d are for the No. 4 phosphor powder shown in TABLE 1; these particles are larger than those in FIGS. 7a and 7b. The mark of acid washing can be observed in individual particle surface. All these particles are yellow, which is the characteristics color of the cerium compound with garnet structure.

Figures 7E, 7F:

FIGS. 7e and 7f are for the phosphor powder samples prepared by standard solid synthesis process; these particles have no facet and no light transmittance.

The particles in FIGS. 7a and 7b have a specific area of $S=32000$ cm$^2$/cm$^3$ and median diameter of $2.2 \leq d_{50} \leq 5$ μm and average diameter of $4 \leq d_{cp} \leq 7$ μm. Particles of such fineness can be processed to from a dense layer without large pores. The thickness of the dense layer is D=200 μm, and the gravitational density of the dense layer can reach $p=4.0$ g/cm$^3$ by the gravimetric method. This phosphor powder having such a high density indicates that the phosphor powder particles are in a round-cone shape, and their light transmittance is very high.

Undoubtedly, the phosphor powder particles with a mirror-like surface are conducive to a high quantum output. It has to be pointed out that the particles of all the standard samples have sharp and fragmented facets, which are greatly distorted and have a low reflectivity. It is quite impossible to conclude the morphology of the particles of the standard samples because no a single particle is intact.

It has been pointed out above that the main function of the phosphor powder according to the present invention is to be used in warm-white LEDs. Further, the phosphor powder according to the present invention has other important applications. First, it can be applied in red scintillator to detect the X-ray and γ-ray emitted from various radioactive isotopes and materials. Its working principle is that ions absorb the primary energy of the X-ray photons and jump into the K shell. The main ions $Gd^{+3}$ conduct K-jump at the energy of $E=48.8$ KeV; terbium ions have a K-jump energy of $E=52$ KeV. On the other hand, Lu atoms in the composition of the phosphor powder have the highest K-jump value at the energy of $E=61.1$ KeV. The aforementioned description explains that the scintillator described above is best in detecting the X-ray with medium energy ($E=45$~80 KeV).

In the mean time, gadolinium-yttrium-lutetium-terbium-aluminum garnet is suitable to detect the radiation of isotope $Xe^{133}$ with an energy of $E=0.081$ KeV, and even the isotope $Kr^{79}$ of energy $E=0.044$ KeV The detectors based on the phosphor powder have been used in many occasions used to analyze the transuranic elements of nuclear reactors (isotope Am, Pr, U, and others) and good results are obtained. It has to point out that the radiation intensity of the phosphor powder is 1.8 times of that of a standard CdWO$_4$ sample, equivalent to the radiation intensity of the best scintillation (based on $Gd_2O_2S.Ce.Pr$) in an X-ray computerized tomography. The phosphor powder has another characteristic: it can react vigorously with thermal or ultra-cold neutrons and form a nuclear reaction: $Gd^{155}+n \rightarrow Gd^{159}+e+\gamma$. Thermal neutrons absorbed by gadolinium can reach 40000 barn (b), which is 100 times of that of other elements and isotopes (Li, B, Gd). It is therefore certain for the phosphor powder according to the present invention to be applied in such a field in the near future.

The most widely applied field of the gadolinium-containing phosphor powder is still as a solid-state light source. The main structure of LEDs is based on the indium-gallium nitride (In—Ga—N) heterojunction (not shown) with a large number of quantum wells. The semiconductor heterojunction is positioned upon the sapphire (or silicon carbide single crystal) thermal conductor base.

The surface of the base is disposed with a spectrum converter (not shown) can be activated by the primary blue light of the heterojunction radiation. The spectrum converter has a uniform thickness distributed on the luminescent planes and laterals of the heterojunction, and interacted with all the first-order radiant lights. The light-emitting diode according to the present invention is required to have this structure because the light emitted from the laterals of the heterojunction accounts for 40% of the entire semiconductor. The working coefficient of the spectrum converter is in a large extent determined by its thickness, capable of converting 60~95% of the primary radiation of the heterojunction.

When the spectrum converter is symmetrical to the center and has a uniform thickness of 100~200 μm on each radiation planes and laterals, the In—Ga—N heterojunction semiconductor according to the present invention will have a very high optical performance.

The important optical performance of the LED and spectrum converter includes the permeability of primary light emitted in addition to its light conversion ability. When the parameters of the warm white light is x=0.45 and y=0.43, the light transmittance rate of the spectrum converter of the LED reaches 20% of the primary blue light radiation.

In addition to the uniformity of the luminescence, the advantages of the LED according to the present invention are listed as follows: the light emitted is warm white light; the chromaticity coordinates are $0.41 \leq x \leq 0.45$, $0.40 < y \leq 0.43$; and the color temperature is $2800K \leq T \leq 3400K$. The LED according to the present invention conforms to the standard of white radiation, and thus is the most suitable light source in our daily lives.

In summary, the advantages of the LED according to the present invention are listed as follows: the light emitted is warm white light; the chromaticity coordinates are $0.41 \leq x \leq 0.45$, $0.40 < y \leq 0.43$; and the color temperature is $2800K \leq T \leq 3400K$, in addition to the uniformity of the luminescence. Further, the LED according to the present invention can create a light source of higher brightness and larger luminous flux, and can indeed overcome the drawbacks of conventional warm-white LEDs.

It is appreciated that although the directional practice device of the present invention is used in a very limited space instead of practicing at the real playing field, effective and steady practice can be obtained as well. Further, it is very easy to set up and to operate the directional practice device of the present invention. These advantages are not possible to achieve with the prior art.

While the invention has been described with reference to the a preferred embodiment thereof, it is to be understood that modifications or variations may be easily made without departing from the spirit of this invention, which is defined by the appended claims.

What is claimed is:

1. An orange-yellow phosphor powder is a rare-earth aluminate having a garnet structure, which is characterized in that its chemical composition has compounds of the IV and V groups elements and the stoichiometry formula of the orange phosphor powder is $(\Sigma Ln)_{3-x}Me^{IV}_{x}Al_{5-y}Si_{y}O_{12-(x+y)}N_{x+y}$, wherein Ln is one or more members selected from the group consisting of Y, Gd, Ce, Lu, and Tb, and $Me^{IV}$ is one or more members selected from the group consisting of Zr and Hf, and the stoichiometry indices are $0.001 \leq x \leq 0.1$ and $0.001 \leq y \leq 0.1$.

2. The orange-yellow phosphor powder as defined in claim 1, which luminesces in the orange-yellow region of the spectrum, ranging from 490~770 nm, with a maximum wavelength of $\lambda_{max} \geq 570$ nm and a half band width larger than 120 nm.

3. The orange-yellow phosphor powder as defined in claim 1, wherein the condition for the formation of the rare-earth cationic sub-crystal in the phosphor powder is as follows:

$\Sigma Ln = mY + Gd + pCe + qLu + lTb$, where $m+n+p+q+l=3-x$.

4. The orange-yellow phosphor powder as defined in claim 3, wherein $f=m+n+p+q+l$ and the concentration of the rare-earth cationic crystal in the phosphor powder is as follows:

Y: $0.05 \leq m/f \leq 0.25$; Gd: $0.50 \leq n/f \leq 0.65$; Ce: $0.001 \leq p/f \leq 0.1$; Lu: $0.001 \leq q/f \leq 0.05$; and Tb: $0.001 \leq l/f \leq 0.05$.

5. The orange-yellow phosphor powder as defined in claim 1, wherein the concentration of silicon ion, $Si^{+4}$, in the anionic sub-crystal is $0.001 \leq [Si] = y \leq 0.1$ atomic fraction.

6. The orange-yellow phosphor powder as defined in claim 1, wherein the particles of the phosphor powder are slightly round with a median particle size of $2.2 \leq d_{50} \leq 5$ μm.

* * * * *